(12) United States Patent
Nawrodt et al.

(10) Patent No.: US 9,085,048 B2
(45) Date of Patent: Jul. 21, 2015

(54) APPARATUS AND METHOD FOR GENERATING SEPARATING FISSURES IN A SUBSTRATE

(71) Applicant: JENOPTIK Automatisierungstechnik GmbH, Jena (DE)

(72) Inventors: Sebastian Nawrodt, Jena (DE); Ronny Ullmann, Rothenstein (DE); Karsten Heinig, Gera (DE); Christian Matthies, Camburg (DE); Juergen Weisser, Jena (DE)

(73) Assignee: JENOPTIK Automatisierungstechnik GmbH, Jena (DE)

( * ) Notice: Subject to any disclaimer, the term of this patent is extended or adjusted under 35 U.S.C. 154(b) by 303 days.

(21) Appl. No.: 13/859,882

(22) Filed: Apr. 10, 2013

(65) Prior Publication Data
US 2013/0270238 A1    Oct. 17, 2013

(30) Foreign Application Priority Data

Apr. 12, 2012    (DE) ................. 10 2012 103 176

(51) Int. Cl.
| | |
|---|---|
| *B23K 26/06* | (2014.01) |
| *B23K 26/08* | (2014.01) |
| *C03B 33/09* | (2006.01) |
| *H01L 21/78* | (2006.01) |
| *B23K 26/36* | (2014.01) |
| *B23K 26/073* | (2006.01) |
| *C03B 33/10* | (2006.01) |
| *B23K 26/00* | (2014.01) |

(52) U.S. Cl.
CPC ............ *B23K 26/367* (2013.01); *B23K 26/0042* (2013.01); *B23K 26/0057* (2013.01); *B23K 26/0087* (2013.01); *B23K 26/06* (2013.01); *B23K 26/0656* (2013.01); *B23K 26/0736* (2013.01); *B23K 26/0738* (2013.01); *B23K 26/08* (2013.01); *B23K 26/365* (2013.01); *C03B 33/09* (2013.01); *C03B 33/091* (2013.01); *C03B 33/102* (2013.01); *H01L 21/78* (2013.01)

(58) Field of Classification Search
CPC ........ B23K 26/06; B23K 26/08; H01L 21/78; C03B 33/09; C03B 33/091
USPC ............ 219/121.61, 121.62, 121.68, 121.69; 65/105, 112; 438/795
See application file for complete search history.

(56) References Cited

U.S. PATENT DOCUMENTS

| | | | | |
|---|---|---|---|---|
| 6,144,011 | A  * | 11/2000 | Moss et al. ............... | 219/121.68 |
| 6,327,875 | B1 | 12/2001 | Allaire et al. | |
| 6,329,632 | B1 * | 12/2001 | Fournier et al. ............ | 219/121.7 |

(Continued)

FOREIGN PATENT DOCUMENTS

| | | |
|---|---|---|
| DE | 43 05 107 A1 | 8/1994 |
| DE | 10 2005 027 800 A1 | 12/2006 |

(Continued)

*Primary Examiner* — Samuel M Heinrich
(74) *Attorney, Agent, or Firm* — Duane Morris LLP

(57) ABSTRACT

The invention is directed to an apparatus and a method for generating separating fissures in a substrate through action of a laser beam having an elliptical beam cross section with a beam spot length in a movement direction along a separating fissure to be generated in the substrate. The apparatus and method are particularly suitable for separating fissures which start or end on the substrate surface. A suitable diaphragm prevents radiation from impinging on the substrate before the start and after the end of the fissure.

10 Claims, 4 Drawing Sheets

(56) References Cited

U.S. PATENT DOCUMENTS

| | | | |
|---|---|---|---|
| 6,555,783 B2* | 4/2003 | Koide | 219/121.73 |
| 7,495,191 B2* | 2/2009 | Chen | 219/121.73 |
| 8,049,138 B2* | 11/2011 | Yamada et al. | 219/121.85 |
| 2003/0217568 A1* | 11/2003 | Koyo et al. | 65/105 |
| 2006/0163223 A1 | 7/2006 | Zhang et al. | |
| 2006/0278619 A1 | 12/2006 | Acker et al. | |
| 2009/0014425 A1 | 1/2009 | Zuehlke et al. | |
| 2009/0127477 A1* | 5/2009 | Tanaka | 250/492.22 |
| 2010/0320249 A1 | 12/2010 | Kluge et al. | |

FOREIGN PATENT DOCUMENTS

| | | |
|---|---|---|
| DE | 10 2008 000 418 A1 | 9/2008 |
| DE | 10 2007 033 242 A1 | 1/2009 |
| JP | 2002 292489 A | 10/2002 |
| WO | WO 96/20062 A1 | 7/1996 |

* cited by examiner

APPARATUS AND METHOD FOR GENERATING SEPARATING FISSURES IN A SUBSTRATE

RELATED APPLICATIONS

The present application claims priority benefit of German Application No. DE 10 2012 103 176.2 filed on Apr. 12, 2012, the contents of which are incorporated by reference in its entirety.

FIELD OF THE INVENTION

The invention is directed to an apparatus and a method for generating separating fissures in a substrate which are provided particularly for severing large, flat substrates of brittle, nonmetallic materials. The separating fissures are generated through the action of a laser beam with an elliptical beam cross section such as is known generically from patent document WO 96/20062 A1.

BACKGROUND OF THE INVENTION

Various methods for generating separating fissures in substrate surfaces are known from the art. Laid Open Application DE 10 2008 000 418 A1 discloses a method in which the surface of a structural component part is heated locally along a predetermined fracture line by means of radiation of a laser source or infrared radiation source. In this case, the radiation energy is applied asymmetrically, the predetermined fracture line being acted upon at short time intervals by two radiation energies of identical or different strengths. In conjunction with a shock cooling carried out subsequently, the formation of a separating fissure takes place along the predetermined fracture line.

A method for cutting brittle bodies described in DE 43 05 107 A1 uses laser radiation to heat the surface of the body along a cutting line. The thermomechanical stress which is built up in this way leads to fracture of the body along the cutting line. The cross section of the laser beam acting on the surface has an elongated shape and is oriented along the cutting line. The length and width of the beam cross section is shaped by optics, and the length can be additionally delimited by variable diaphragms.

In the laser method shown in WO 96/20062 A1 and the apparatus suitable for this method, a guided superficial separating fissure is produced in the material by generating a locally limited thermoelastic stress, and the substrate can subsequently be broken along this separating fissure. The thermal stresses occur between a zone of the substrate surface which is heated locally by suitable laser radiation and in which compressive stresses are generated and a subsequent shock cooling which is realized by a directed coolant jet and by means of which tensile stresses are generated. The controlled separating fissure is formed when the region with the greatest stress difference moves relative to the substrate surface proceeding from an artificially produced initiating defect. A substrate which is broken along this separating fissure has a high-quality break edge which is completely free from edge damage compared to conventional scribing-and-breaking methods using small carbide wheels or diamonds.

The apparatus disclosed in the above-cited WO96/20062 A1 comprises a suitable laser beam source whose radiation is partially absorbed by the substrate so that a local heating can take place. The laser radiation is directed to the substrate surface. The laser beam is shaped by beam-shaping optics to form an elliptical beam spot on the substrate surface, and the length of the major axis of the ellipse oriented in direction of the relative movement is a multiple of the length of the minor axis oriented transverse to the relative movement. To generate the stress difference, the point of impingement of the directed coolant jet follows the elliptical beam spot in direction of the relative movement. The relative movement between the optics with the downstream coolant jet and the substrate is likewise realized by the apparatus. To this end, the substrate is moved linearly relative to the optics. The specific adjustment of process parameters such as movement speed, laser power, beam spot shaping and cooling parameters allows the formation of the separating fissure to be influenced in a deliberate manner.

In Laid Open Application DE 10 2007 033 242 A1, the basic principle of the method described above is used to cut a flat substrate into a plurality of rectangular sections of optional size. This is done by generating preferably orthogonally intersecting separating fissures which are generated in a first machining direction and second machining direction. The separating fissures are always started at an initiating artificially produced defect at an outer edge of the substrate and end again also at an outer edge of the substrate. The machining is carried out on the upper side of preferably small substrates which are placed on a horizontally oriented supporting surface and which have the usual dimensions of semiconductor wafers. The relative movement between the optics and the substrate is carried out by means of a movement of the supporting surface, and therefore also of the substrate supported thereon, on a linear axis of the apparatus. To adjust the second machining direction, the substrate is rotated around a perpendicular axis of rotation of the apparatus. The relative movement for generating the separating fissure in the second machining direction takes place subsequently with the same linear axis as for the first machining direction. For larger substrates, for example, flat glass substrates which have the standardized dimensions for float glass production and which are to be provided with separating fissures in two machining directions, the relative movement and the rotation of the substrate relative to the optics could only be carried out by moving the supporting surface or the substrate itself at a high cost of construction and with a correspondingly large space requirement.

The above-mentioned problem relating to rotational movement can be solved by the apparatus disclosed in Laid Open Application DE 10 2005 027 800 A1. In this case, in order to realize the second machining direction which is preferably oriented orthogonal to the first machining direction, the optics are integrated in a machining head with which the beam spot and the coolant jet aligned with the beam spot can be rotated synchronously around a perpendicular axis of rotation. In order to bring about the relative movement in both machining directions, it is necessary to provide a second linear axis which is oriented orthogonal to the first linear axis and by means of which the substrate can be moved.

The use of two directed coolant jets in the above-cited DE 10 2005 027 800 A1 is to be regarded as a further advantage over the apparatus from DE 10 2007 033 242 A1. For this purpose, a coolant jet is arranged at both ends of the major axis of the elliptical beam spot symmetric to the beam axis. This arrangement allows the substrate to be machined in alternating senses in one machining direction by always using only the respective coolant jet following the beam spot in the machining direction. Accordingly, separating fissures can be generated from opposing substrate edges in an alternating manner. In this apparatus also, the relative movement is carried out by moving the substrate or supporting surface. Thus it follows that only substrates having small dimensions can be machined in this case also.

Use of the apparatus requires that a separating fissure always starts at an outer edge of the substrate and also ends at an outer edge of the substrate starting from an initiating defect. For this reason, the relative movement is carried out in such a way that the corresponding linear axis is always moved from a predetermined starting point to a predetermined target point. To achieve the thermoelastic stress at the starting and end points of the separating fissures that is needed for generating the separating fissures, these points must be covered by the whole length of the elliptical beam spot extending in the major axis and by the coolant jet. Therefore, the starting point and target point of the linear axes must be predetermined in such a way that the entire beam spot always lies outside the substrate at the starting point and end point of the separating fissure. In terms of control, the apparatus is not designed to have a separating fissure start or end, for example, in the middle of the substrate surface.

Moreover, continuous separating fissures bring about the result that the only cuts that can be made between two separating fissures which are adjacent in a machining direction are those whose edges which are oriented in the first machining direction and second machining direction have the same length as the cuts which are adjacent in the corresponding direction. Therefore, it is not possible for cuts differing from the edge lengths of adjacent cuts in at least one machining direction to be made from a substrate.

For certain technical applications it would be advantageous if separating fissures could start and end at any points on the substrate surface. Thus, for instance, the substrate surfaces could be exploited in an optimal manner according to need by cuts arranged in a nested manner. With a nested arrangement, separating fissures in one machining direction could have starting points and end points at separating fissures in the other machining direction so that a T-shaped intersection is formed. As has already been noted, using the apparatuses and methods identified from the prior art requires that the whole length of the elliptical beam spot extending in the major axis and the coolant jet must run over the starting point and end point of a separating fissure. Therefore, in case of very long elliptical beam spots, the distance to be run over is also very long. As a result, the problem arises for T-shaped intersections that the beam spot impinges on the separating fissure extending transverse to the machining direction and on the adjoining portion of the substrate that is not to be severed. This can cause breaking defects in the subsequent breaking process, and the cut extending transverse to the machining direction may be damaged.

SUMMARY OF THE INVENTION

It is an object of the invention to provide a method and an apparatus suitable for this method which make it possible to generate separating fissures in a surface of substrates by laser, where the start and the end of the separating fissures do not lie at the outer edges of the substrate.

A further object of the invention is to provide an apparatus and a method which make it possible to prevent the laser radiation from acting past the starting point or end point of a separating fissure.

By means of an apparatus for generating separating fissures in a substrate through action of a laser beam with an elliptical beam cross section having a workpiece receptacle for receiving a substrate, a laser source for emitting a laser beam, a laser head with optics arranged downstream of the laser source in beam output direction, having an optical axis, wherein the optical axis and, therefore, the laser beam are directed perpendicularly onto the surface of the received substrate. The optics are configured to shape the laser beam in such a way that it has an elliptical beam cross section and forms on the surface of the substrate an elliptical beam spot having a beam spot length and a beam spot width. A movement device is included for moving the laser head in a movement direction along a separating fissure which is to be generated in the received substrate and which has a start and an end. The beam spot length is oriented along the movement direction, and a control device for controlling the process flows. The above-stated objects are met according to the invention in that there is provided between the optics and the workpiece receptacle, in a diaphragm plane perpendicular to the optical axis, a blocking-out device which communicates with the laser head and which has a diaphragm whose aperture can be varied with respect to the position and/or size thereof along the movement direction in order to cut off the laser beam in a continuously decreasing or increasing manner over the beam spot length so as to prevent the laser beam from impinging on the substrate before the start of fissure and beyond the end of fissure.

The diaphragm is a variable diaphragm which is fixedly connected to the laser head, and the diaphragm aperture is a diaphragm aperture that is continuously variable over the length of the diaphragm aperture, with a maximum length that is greater than or equal to a beam cross section length in the diaphragm plane and a width that is greater than or equal to a beam cross section width in the diaphragm plane.

In particular, the variable diaphragm can have at least one blocking-out slide which is movable relative to the laser beam and in the manner of a window blind.

The diaphragm can also be a rigid diaphragm with an edge region which is wider in movement direction than a beam cross section length in the diaphragm plane, the rigid diaphragm is displaceable at the laser head along the movement direction, and the diaphragm aperture is correspondingly a rigid diaphragm aperture, with a length that is greater than or equal to the beam cross section length and a width that is greater than or equal to a beam cross section width in the diaphragm plane.

It is advantageous when the diaphragm plane is located directly behind the optics at the greatest possible distance from the substrate so that the diaphragm can be constructed as small as possible.

The above-stated objects are met for a method for generating separating fissures in a substrate through action of a laser beam with an elliptical beam cross section having the following method steps:

receiving and positioning a substrate in a workpiece receptacle;

generating a laser beam with an elliptical beam cross section to form an elliptical beam spot with a beam spot length and a beam spot width on the surface of the received substrate;

directing the laser beam onto the received substrate, wherein the beam spot length is oriented in direction of a separating fissure which is to be generated and which has a start and an end, and guiding the laser beam along the separating fissure to be generated from the start of fissure to the end of fissure, wherein the laser beam is cut off at least periodically, namely decreasingly cut off from the start of fissure and increasingly cut off toward the end of fissure, by a diaphragm which is arranged in a diaphragm plane and which is guided at least periodically with the laser beam, so that the substrate is not acted upon by the laser beam before the start of fissure or beyond the end of fissure.

The laser beam is directed onto the substrate in such a way that, irrespective of the diaphragm, the laser beam abuts with its beam spot length on the start of fissure at the commencement of beam guidance in extension of the separating fissure and abuts with its beam spot length on the end of fissure at the termination of beam guidance in extension of the separating fissure, wherein, however, as a result of the provided diaphragm, the laser beam is cut off completely in each instance by the diaphragm.

It is advantageous when the decreasing and increasing cutting off of the laser beam takes place in that a variable diaphragm with a variable diaphragm aperture is used as diaphragm, and the completely closed variable diaphragm aperture is completely opened at the commencement of beam guidance, and the variable diaphragm aperture is completely closed again at the termination of beam guidance, while the variable diaphragm remains stationary in relation to the guided laser beam, wherein the complete opening and closing of the variable diaphragm aperture is effected at a speed corresponding to the beam guidance (of the laser beam).

It is likewise advantageous when the decreasing and increasing cutting off of the laser beam is carried out in that a rigid diaphragm with an edge region and with a rigid diaphragm aperture is used as diaphragm, and the rigid diaphragm whose rigid diaphragm aperture abuts on the start of the separating fissure remains stationary relative to the guided laser beam at the commencement of beam guidance, while the laser beam is guided into the diaphragm aperture until the edge region thereof no longer has a cutting off effect and is then guided along with the laser beam at a speed corresponding to the beam guidance until the rigid diaphragm aperture encounters the end of fissure and then comes to rest again relative to the guided laser beam, while the laser beam continues to be guided along the edge region until it is completely cut off.

The method is particularly advantageous when a decreasing and/or increasing cutting off of the laser beam only takes place when the start of fissure and/or the end of fissure lies within the surface of the substrate.

BRIEF DESCRIPTION OF THE DRAWINGS

The invention will be described more fully in the following drawings with reference to embodiment examples. The accompanying drawings show.

DESCRIPTION OF THE EMBODIMENTS

Figure 1:
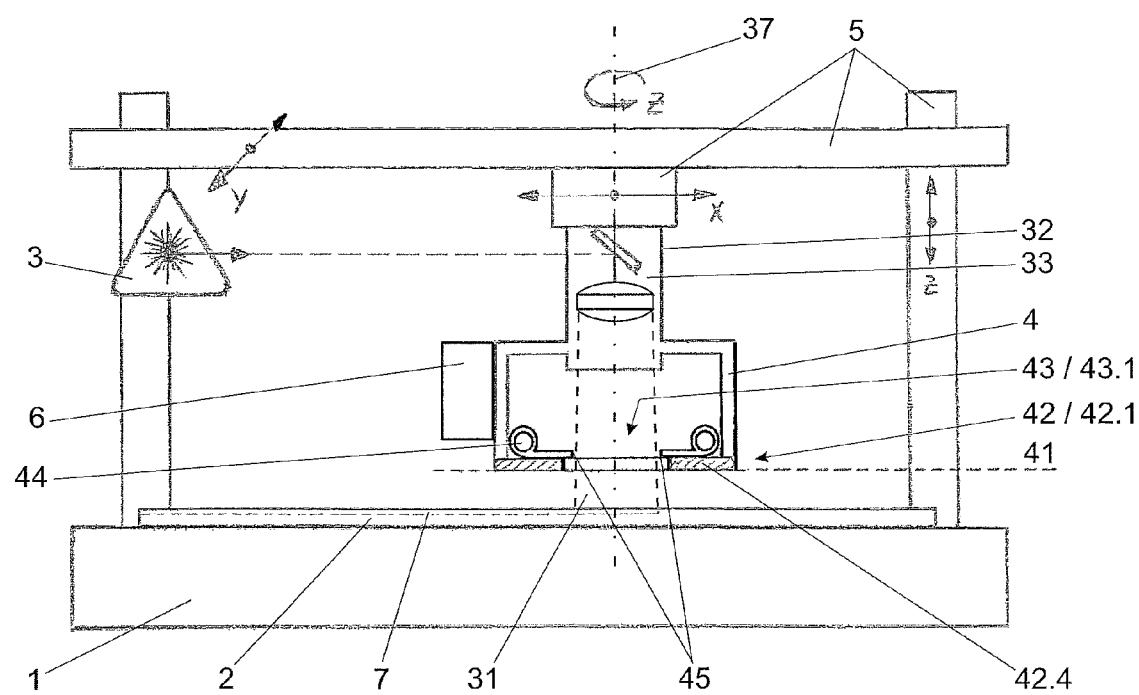
FIG. 1 is a schematic diagram illustrating the apparatus according to a first embodiment example with a variable diaphragm.
Figure 3:
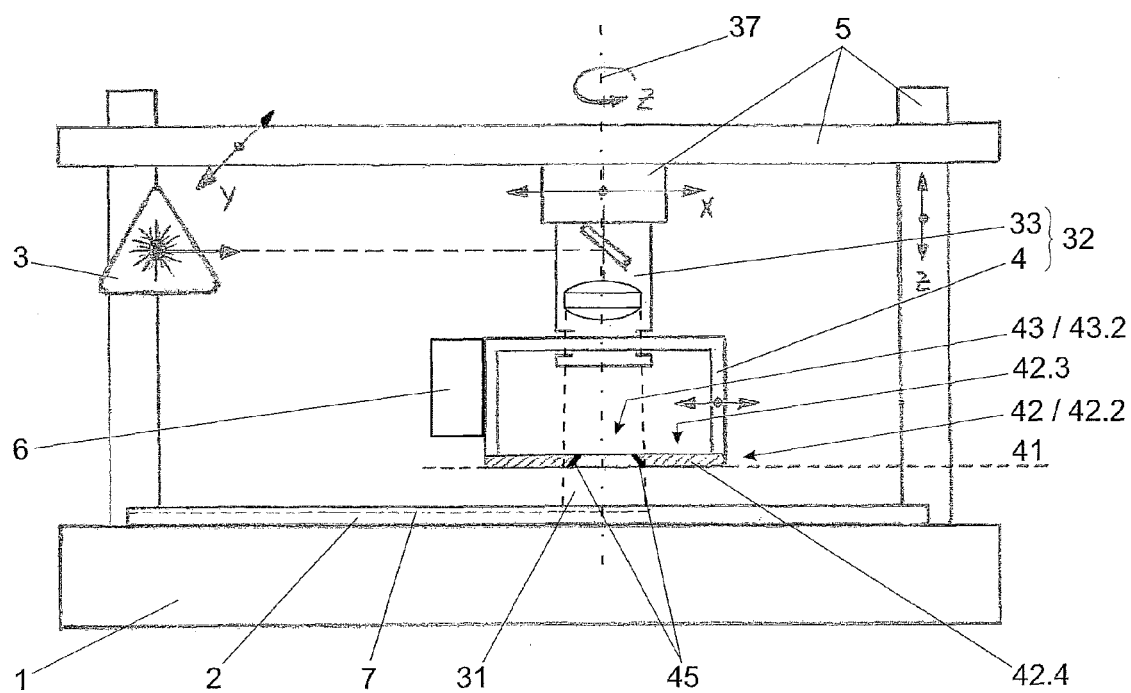
FIG. 3 is a schematic diagram illustrating the apparatus according to a second embodiment example with an apparatus according to the second embodiment example.

As is shown in FIG. 1 and FIG. 3, the apparatus basically has a laser source 3, a laser head 32 with optics 33, a blocking-out device 4 with a diaphragm 42, and a workpiece receptacle 1. The optics 33 are so arranged and configured that they direct a laser beam 31 emitted by the laser source 3 perpendicularly onto a substrate 2 arranged in the workpiece receptacle 1.

The two embodiment examples described herein differ essentially only with respect to the construction of the diaphragm 42 and the fixed or movable arrangement of the blocking-out device 4 at the laser head 32.

Figure 2:
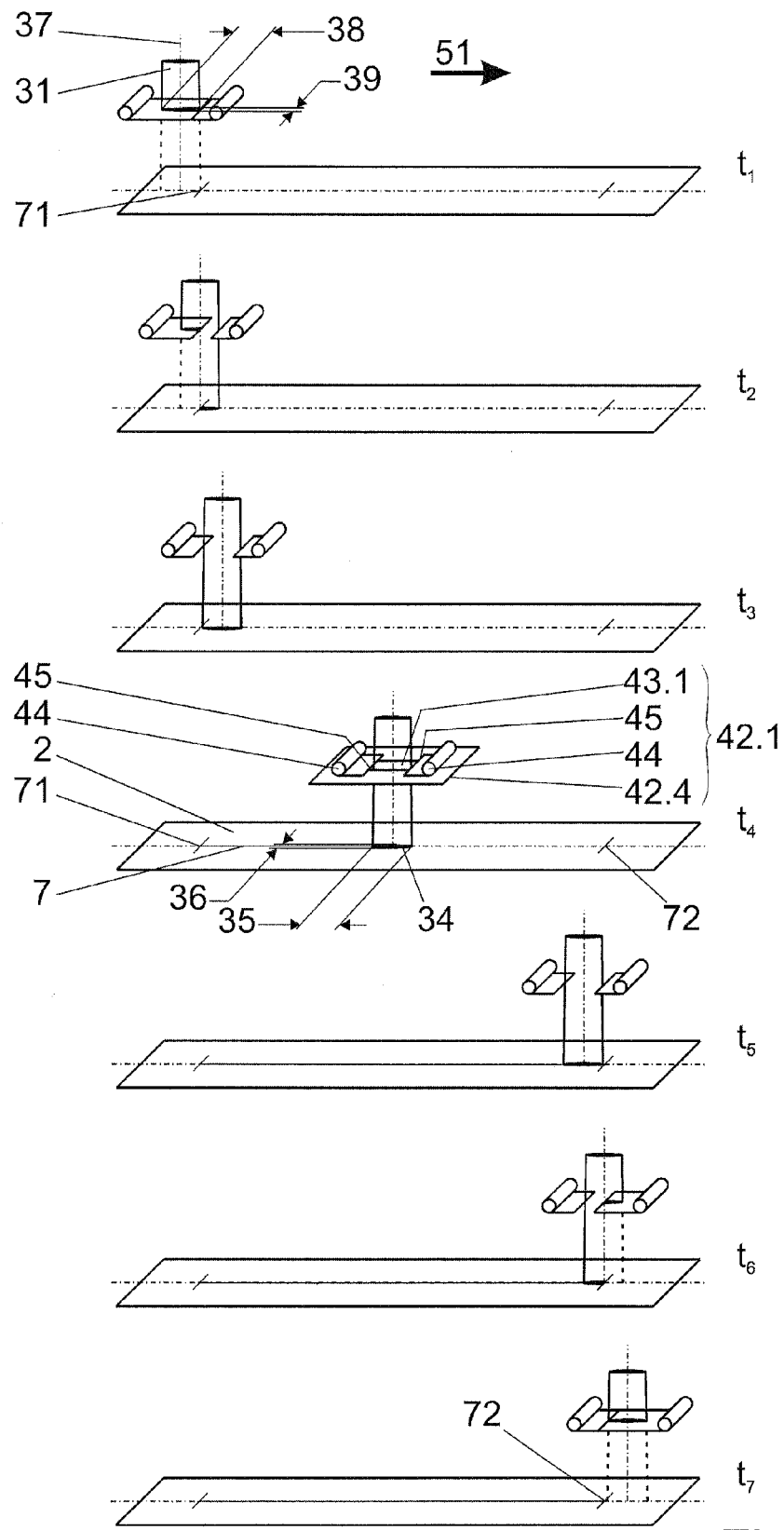
FIG. 2 is a schematic diagram illustrating the flow of the method with an apparatus according to the first embodiment example.

As is shown in FIG. 1 and FIG. 2, the two-dimensionally extensive substrate 2 rests flat on a planar workpiece receptacle 1. The substrate 2 is advantageously oriented horizontally in the workpiece receptacle 1. With this orientation, handling of the substrate 2 is facilitated, and the substrate 2 can be held horizontally in a simple manner and received without stresses.

Lateral stops on which the substrate 2 can abut by its outer edges can be provided at the workpiece receptacle 1 in order to achieve a defined position of the substrate 2 in the apparatus. This can facilitate machining of a plurality of identical substrates 2.

A movement device 5 is arranged opposite to the workpiece receptacle 1. The movement device 5 carries the laser head 32 that is provided for guiding the laser beam 31 and is so configured that its range of movement covers the entire area of the workpiece receptacle 1.

The laser beam 31 generated by a laser source 3 is directed to the surface of the substrate 2 via the optics 33 of the laser head 32 along an optical axis 37 directed perpendicular to the workpiece receptacle 1. The laser head 32 can be moved by the movement device 5 linearly in all three spatial axes x, y and z and rotationally around spatial axis z relative to the substrate 2.

The laser beam 31 is shaped by the optics 33 to form a laser beam 31 with an elliptical beam cross section so that an elliptical beam spot 34 can be generated on the surface of the substrate 2. The dimensions of the elliptical beam spot 34 can be described geometrically by a beam spot length 35 lying in the major axis and a beam spot width 36 lying in the minor axis. For proper use of the apparatus it is advantageous when the length 35 of the beam spot is a multiple of its width 36.

The laser head 32 is aligned in a movement direction 51 by the movement device 5 such that the elliptical beam spot 34 is oriented with its length 35 exactly in movement direction 51 along a separating fissure 7 to be generated in the surface of the substrate 2.

It will be clear to the skilled person that a movement in a movement direction on principle leaves open the sense of direction of the movement. For purposes of an easily understandable description, the movement direction 51 is understood hereinafter to mean a direction in only one sense.

Downstream of the optics 33 in radiating direction and fixedly connected to the laser head 32, the blocking-out device 4 with diaphragm 42 is arranged between optics 33 and workpiece receptacle 1. The diaphragm 42 is connected to a control device 6, with which a drive is associated, and has a diaphragm aperture 43 whose relative position with respect to the workpiece receptacle 1 defines a diaphragm plane 41 lying orthogonal to the optical axis 37.

Corresponding to the length 35 and width 36 of the beam spot 34 on the surface of the substrate 2, the laser beam 31 has a beam cross section length 38 and a beam cross section width 39 in the diaphragm plane 41 depending on the divergence of the laser beam 31 and the distance of the diaphragm plane 41 from the surface of the substrate 2.

If the distance of the diaphragm plane 41 from the surface of the substrate 2 is only very short, the beam cross section length 38 in the diaphragm plane 41 corresponds approximately to the beam spot length 35 even with a laser beam 31 that is divergent in movement direction 51, and the diaphragm 42 must therefore be suitably large in a corresponding manner for the largest possible beam cross section length 38, which results in a relatively high dynamic load.

Therefore, it is advantageous to arrange the diaphragm 42 and, therefore, the diaphragm plane 41 directly behind the optics 33 at the greatest possible distance from the substrate 2. The diaphragm 42 can accordingly be constructed as small as possible and, as will be explained in the following referring to the two fundamentally different diaphragms 42, the dynamics of the diaphragm 42 can be reduced to a minimum defined by the shortest possible beam cross section length 38.

The diaphragm 42 can be constructed essentially as a variable diaphragm 42.1 or as a rigid diaphragm 42.2, the action thereof on the laser beam being the same in each case.

The blocking out of the laser beam 31 by means of the diaphragm 42 is carried out exclusively in direction of the beam cross section length 38 and, therefore, in the movement direction 51 along the separating fissure 7 to be generated. In this respect, the change in the cut off can be carried out in a continuously increasing manner from a complete cutting off of the laser beam 31 to a complete unblocking of the laser beam 31, and vice versa.

According to the first embodiment example, the diaphragm 42 is constructed as a variable diaphragm 42.1 and the diaphragm aperture 43 is constructed as a variable diaphragm aperture 43.1.

Additionally referring to FIG. 1, FIG. 2 shows the function of the variable diaphragm 42.1 at various positions of the separating fissure 7 with different conditions of the aperture at times $t_1$ to $t_7$.

In a first embodiment, the variable diaphragm 42.1 is formed of a diaphragm frame 42.4 (shown in FIG. 2 only at time $t_4$) enclosing a slit-shaped aperture and two adjustable blocking-out slides 44 arranged across from one another in the diaphragm plane 41. One of the blocking-out slides 44 is arranged in front of the laser beam 31 and the second blocking-out slide 44 is arranged behind the laser beam 31 referring to movement direction 51.

The blocking-out slides 44 can be moved independently from one another and relatively with respect to the laser beam 31 by means of the drive. To this end, they are moved in the manner of window blinds in direction of the beam cross section length 38 into or out of the laser beam 31. Each of the blocking-out slides 44 is so dimensioned that it can completely open and also completely occlude the area of the beam cross section length 38. The change in occlusion can be carried out continuously. Accordingly, the variable diaphragm aperture 43.1 can be adjusted in a flexible manner in size and in direction to the decreasing or increasing occlusion.

A material with good thermal conductivity which can completely prevent the transmission of the laser beam 31, is not reflective and is thermally stable is used for the blocking-out slides 44. To mitigate diffraction effects, the blocking-out slides 44 have a diaphragm edge 45 provided with an acute angle. The diaphragm edges 45 of the blocking-out slides 44 can meet in the diaphragm plane 41 or can be arranged in such a way that one blocking-out slide 44 can run past the other above the diaphragm plane 41 and one blocking-out slide 44 can run past the other below the diaphragm plane 41.

In another embodiment of the apparatus, it can also be sufficient to use only one individual blocking-out slide 44 which is arranged on one side in front of or behind the laser beam 31 in movement direction 51. Accordingly, either an increasing cutting off of the laser beam 31 or a decreasing cutting off of the laser beam can then be carried out relative to the substrate 2.

In all of the embodiments of the apparatus with a variable diaphragm 42.1, the blocking-out device 4 is fixedly connected to the laser head 32 so that the variable diaphragm 42.1 is permanently moved along with optics 33.

The flow of the method according to the invention using an apparatus corresponding to the first embodiment form will be explained below referring to the following method steps.

In a first method step, a substrate 2 is placed flat upon the planar workpiece receptacle 1 and positioned against stops, if any, of the workpiece receptacle 1.

In a further method step, a laser beam 31 with an elliptical beam cross section is generated, forming on the surface of the substrate 2 an elliptical beam spot 34 with a beam spot length 35 corresponding to the major axis of the elliptical beam spot 34 and a beam spot width 36 corresponding to the minor axis of the elliptical beam spot 34.

In the following method step, this laser beam 31 is directed perpendicularly onto the surface of the received substrate 2 and is guided over the substrate 2 along a separating fissure 7 to be generated in a movement direction 51 from a start 71 of fissure to an end 72 of fissure; according to the invention, the laser beam 31 is either unblocked or cut off during this movement. This unblocking or cutting off is controlled by the control device 6.

The beam spot length 35 is oriented in direction of the separating fissure 7 to be generated. Corresponding to the position of the laser beam 31 relative to the start 71 of fissure and end 72 of fissure, the laser beam 31 is periodically cut off by a blocking-out device 4 which is guided along with the laser beam 31 and which has a diaphragm 42 forming a diaphragm plane 41. The cutting off is carried out in such a way that the laser beam 31 is cut off decreasingly from the start 71 of fissure and increasingly toward the end 72 of fissure. In this way, the laser beam 31 is prevented from impinging on the substrate 2 before the start 71 of fissure and past the end 72 of fissure.

The process of occlusion can be performed in different ways depending on the design of the diaphragm 42. In the following, the process will be described referring to an apparatus with a variable diaphragm 42.1 which corresponds to the first construction of the first embodiment example comprising two separately controllable blocking-out slides 44 with the blocking-out device 4 stationary with respect to the laser beam 31. In this connection, a separating fissure 7 to be produced is assumed to have a start 71 and an end 72 which do not lie at the edge of the substrate 2 but rather at a distance from the edge inside the substrate 2.

As is shown in FIG. 2 at time $t_1$, at the commencement of the beam guidance with the elliptical beam spot 34 adjoining the start 71 of fissure, the laser beam 31 is positioned directly in front of the start 71 of the separating fissure 7 (indicated in FIG. 2 by the extension of the laser beam 31 with dotted line). At this time $t_1$, the laser beam 31 is completely cut off by the variable diaphragm 42.1. For this purpose, the blocking-out slide 44 downstream of the laser beam 31 in movement direction 51 (hereinafter designated as rear blocking-out slide 44) is moved out in movement direction 51 until its diaphragm edge 45 in the diaphragm plane 41 abuts on the end of the beam cross section length 38 facing in movement direction 51. In a perpendicular projection of the diaphragm plane 41 on the surface of the substrate 2, the diaphragm edge 45 simultaneously occupies a position abutting exactly on the start 71 of fissure.

At this time $t_1$, the blocking-out slide 44 upstream of the laser beam 31 in movement direction 51 (hereinafter designated as front blocking-out slide 44) is located with its diaphragm edge 45 in front of the laser beam 31 completely outside the beam cross section length 38 so that the diaphragm edges 45 of the two blocking-out slides 44 are arranged directly opposite one another and adjoining one another.

At the commencement of the beam guidance, the laser beam 31 and the variable diaphragm 42.1 are moved at a given speed along the separating fissure 7 relative to the substrate 2. The diaphragm edge 45 of the rear blocking-out slide 44 remains in a position that is unchanged with respect to the substrate 2 so that the laser beam 31 moves into the variable diaphragm aperture 43.1 relative to the diaphragm edge 45. The diaphragm edge 45 is able to remain in this position because the rear blocking-out slide 44 is moved in synchronous with the speed at which the beam is guided. In so doing, as is shown in FIG. 2 at time $t_2$, the variable diaphragm aperture 43.1 enlarges so that the cutting off of the laser beam 31 decreases by degrees. As a result of the synchronous movement of the rear blocking-out slide 44, the substrate 2 is first acted upon by the laser beam 31 starting from the start 71 of fissure. The front blocking-out slide 44 remains in an unchanged position relative to the laser beam 31 and is moved along as the beam is guided.

The rear blocking-out slide 44 continues to be moved in synchronous with the guiding of the beam until the laser beam 31 is completely unblocked. This position is reached at time $t_3$ in FIG. 2 as soon as the laser beam 31 has moved by the entire beam cross section length 38 over the diaphragm edge 45 of the rear blocking-out slide 44 into the variable diaphragm aperture 43.1. After this time $t_3$, the synchronous moving in of the rear blocking-out slide 44 can be terminated.

Continued guidance of the beam along the separating fissure 7 is carried out corresponding to FIG. 2 at time $t_4$ with the position of the diaphragm edges 45 of the two blocking-out slides 44 remaining unchanged relative to the laser beam 31.

As soon as the elliptical beam spot 34 impinges on the end 72 of the separating fissure 7 or the diaphragm edge 45 of the front blocking-out slide 44 adjoins the end 72 of fissure in a perpendicular projection of the diaphragm plane 41 on the surface of the substrate 2, the front blocking-out slide 44 remains in an unchanged position with respect to the substrate 2. The diaphragm edge 45 is made to remain in this position because the front blocking-out slide 44 is moved out synchronous with the speed at which the beam is guided. This position is reached at time $t_5$ in FIG. 2.

The laser beam 31 accordingly moves relative to the diaphragm edge 45 of the front blocking-out slide 44 out of the variable diaphragm aperture 43.1. As is shown in FIG. 2 at time $t_6$, the variable diaphragm aperture 43.1 decreases in so doing so that the occlusion of the laser beam 31 gradually increases. As a result of the synchronous movement of the rear blocking-out slide 44, the laser beam 31 does not impinge on the substrate 2 beyond the end 72 of fissure.

The beam guidance is terminated when the laser beam 31 with the elliptical beam spot 34 adjoining the end 72 of fissure is situated directly behind the end 72 of the separating fissure 7 (indicated at time $t_7$ in FIG. 2 by the extension of the laser beam 31 with dotted lines). At this time, the laser beam 31 is completely cut off by the variable diaphragm 42.1. For this purpose, the front blocking-out slide 44 is moved out counter to the movement direction 51 until its diaphragm edge 45 abuts in the diaphragm plane 41 on the end of the beam cross section length 38 facing away from the movement direction 51. The diaphragm edges 45 of the two blocking-out slides 44 are now again arranged so as to be directly opposed and adjoining one another.

Another embodiment of the method is realized in that only one individual blocking-out slide 44 is used to cut off the laser beam 31. This is applied, for example, for substrates 2 in which the separating fissure 7 always starts at the outer edge of the substrate 2 and only the end 72 of fissure lies within the surface of the substrate 2. In this case, the laser beam 31 need not be cut off at the start 71 of fissure and only a front blocking-out slide 44 is required to cut off the laser beam 31 at the end 72 of fissure.

The laser beam 31 is positioned at the commencement of the beam guidance in extension of the separating fissure 7 in front of the outer edge of the substrate 2. The diaphragm edge 45 of the blocking-out slide 44 is arranged in front of the laser beam 31 completely outside of the beam cross section length 38. At the commencement of the beam guidance, the laser beam 31 is guided along the separating fissure 7 on the material without being cut off.

The further process with synchronous occlusion at the end 72 of fissure corresponds to the sequence described above.

The synchronous occlusion of the laser beam 31 is used to limit the action of the laser beam 31 on the substrate surface in a locally dependent manner. In this way, it is possible, for example, to generate separating fissures 7 in the substrate 2 which meet in a T-shaped manner. Separating fissures 7 which meet in a T-shaped manner have a start 71 of fissure or an end 72 of fissure which lies within the surface of the substrate 2 at a transversely extending separating fissure 7. Two effects can be achieved by the movement-synchronous occlusion of the laser beam 31.

The first effect consists in that, in the region of the substrate 2 lying outside of the separating fissure 7, the laser beam 31 is prevented from thermally acting upon, and thereby damaging, a region of the substrate 2 lying in front of the start 71 of fissure or behind the end 72 of fissure and transversely extending separating fissure 7. This is necessary particularly for substrates 2 having a sensitive coating on the surface.

A further effect is provided, as opposed to solutions for protecting the region of the substrate 2 located outside of the separating fissure 7, in that the laser beam 31 is not unblocked until the beam spot 34 is located completely within the region of the separating fissure 7. As a result of the movement-synchronous occlusion, every point between the start 71 of fissure and end 72 of fissure can be acted upon by the laser beam 31 with exactly the same laser power that would also be applied if the laser beam 31 were moved over the start 71 of fissure and end 72 of fissure without being cut off.

Figure 4:
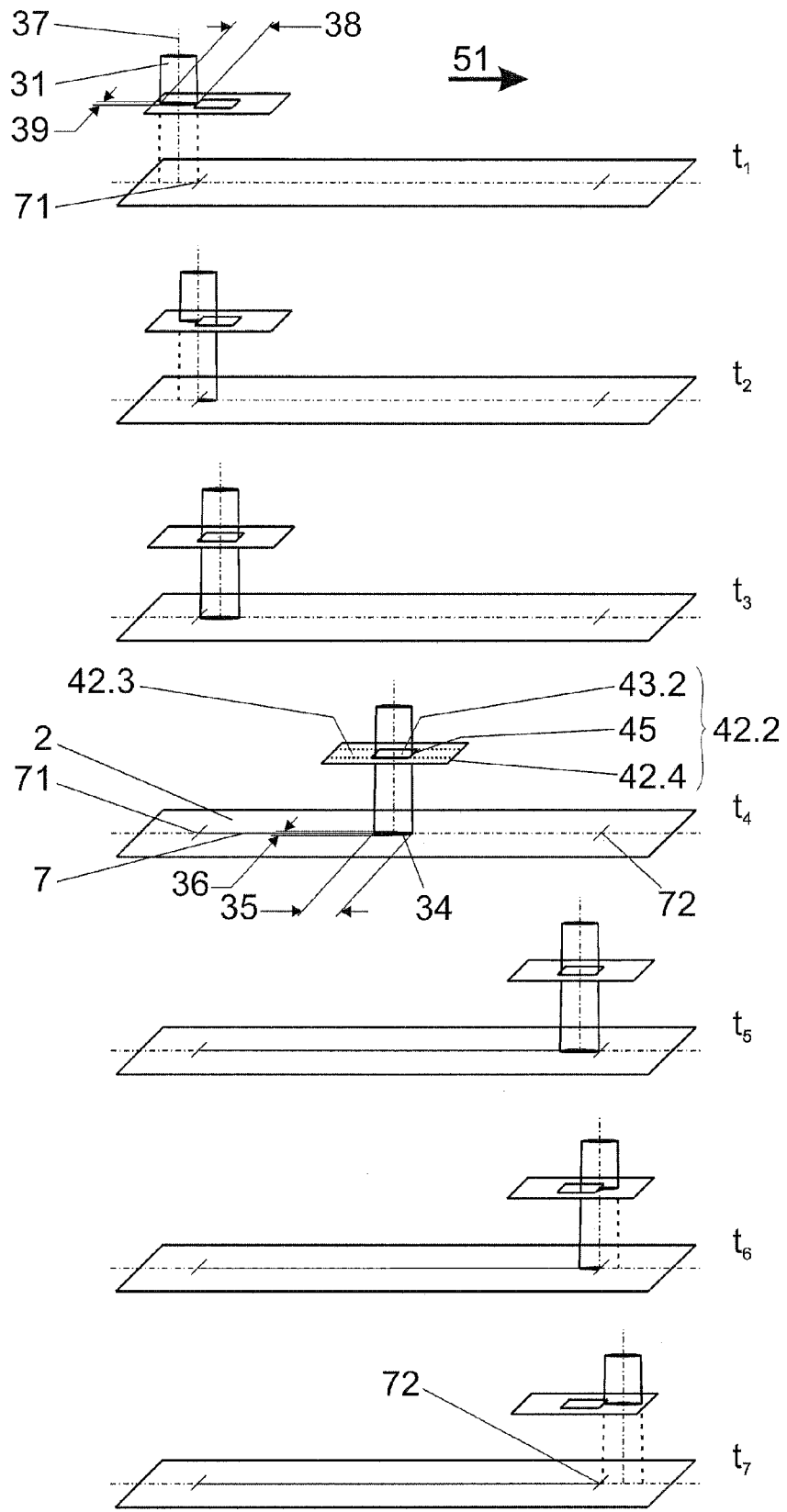
FIG. 4 is a schematic diagram illustrating the flow of the method with a rigid diaphragm.

According to a second embodiment example shown in FIG. 3, the apparatus has a blocking-out device 4 which is movably arranged at the laser head 32 and which has a diaphragm 42 in the form of a rigid diaphragm 42.2 and a diaphragm aperture 43 in the form of a rigid diaphragm aperture 43.2. The blocking-out device 4 is arranged so as to be displaceable relative to the laser head 32 in movement direction 51 by means of the drive of the control device 6. Referring additionally to FIG. 3, FIG. 4 shows the rigid diaphragm 42.2 functioning at various positions of the separating fissure 7 with different aperture conditions at times $t_1$ to $t_7$.

The rigid diaphragm 42.2 is formed by a diaphragm frame 42.4 which encloses the rigid diaphragm aperture 43.2. The diaphragm frame 42.4 has edge regions 42.3 for occlusion. The diaphragm frame 42.4 is a rectangular plate made of aluminum or another material suitable as an absorber for the employed wavelength of the laser beam 31. To reduce reflections, the surface of the diaphragm frame 42.4 has an anti-reflective surface or coating at least in the edge regions 42.3. The thickness of the diaphragm frame 42.4 is selected in such a way that cooling channels can be integrated which allow a preferably water-based coolant to flow through.

The rigid diaphragm aperture 43.2 is arranged centrically in the diaphragm frame 42.2; the shape and dimensioning of the rigid diaphragm aperture 43.2 are governed by the shape and dimensioning of the laser beam 31 in the diaphragm plane 41. When the laser beam 31 is shaped elliptically, the rigid diaphragm aperture 43.2 is configured as a rectangle corresponding at least to the beam cross section length 38 and beam cross section width 39 in the diaphragm plane 41. All diaphragm edges 45 of the rigid diaphragm aperture 43.2 used for cutting off the laser beam 31 are provided with an edge angle of ≤70° to prevent diffraction effects; the acute-angled diaphragm edges 45 are arranged on the side of the diaphragm frame 42.4 facing in direction of the optics 33.

The rigid diaphragm 42.2 is movably arranged at the laser head 32 so that it can be displaced in both directions along the beam cross section length 38 oriented in movement direction 51. Accordingly, the laser beam 31 passing completely through the rigid diaphragm aperture 43.2 can be increasingly cut off either in movement direction 51 or counter to movement direction 51. The center of the rigid diaphragm aperture 43.2 is moved relative to the laser beam 31 to cut off the laser beam 31. This is carried out by means of the drive of the control device 6 through motor-actuated displacement of the entire blocking-out device 4 at optics 33.

The cutting off is carried out by means of the two edge regions 42.3 of the rigid diaphragm 42.2. In order to completely cover the laser beam 31, these two edge regions 42.3 are dimensioned in such a way in movement direction 51 on both sides of the rigid diaphragm aperture 43.2 that they correspond at least to the beam cross section length 38 of the laser beam 31 in the diaphragm plane 41. The rigid diaphragm 42.2 accordingly has a total length of at least three times the beam cross section length 38 of the laser beam 31 in the diaphragm plane 41.

The movement of the rigid diaphragm 42.2 relative to the laser beam 31 can be described with reference to three essential positions. Considered in the machining direction 51, the diaphragm frame 42.4 can occupy a front end position, a middle position and a rear end position. In the front end position, the rigid diaphragm aperture 43.2 is positioned outside and in front of the laser beam 31 in movement direction 51. In this position, the laser beam 31 is completely cut off by the edge region 42.3 downstream of the rigid diaphragm aperture 43.2 in movement direction 51. In the middle position, the center of the rigid diaphragm aperture 43.2 is located exactly on the optical axis 37 so that the laser beam 31 is completely unblocked. In the rear end position, the rigid diaphragm aperture 43.2 is again positioned outside the laser beam 31, behind the laser beam 31 in movement direction 51. In this position, the laser beam 31 is completely cut off by the edge region 42.3 in front of the rigid diaphragm aperture 43.2 in movement direction. These positions and all intermediate positions can be adjusted continuously, and the decreasing and increasing cutting off can take place in both directions.

All of the types of diaphragms 42 mentioned in the embodiment examples have in common that the decreasing and increasing cutting off of the laser beam 31 in all movement directions 51 can take place so as to be synchronized with a speed of the movement system 5 corresponding to the beam guidance. The difference consists in the construction of the blocking-out device 4 and in the way that this blocking-out device 4 or components thereof are moved by means of the drive of the control device 6. As was already mentioned, either the variable diaphragm 42.1 is opened and closed, while the blocking-out device 4 remains stationary relative to the moving laser beam 31, or the rigid diaphragm 42.2 is moved relative to the moving laser beam 31, and the blocking-out device 4 remains stationary relative to the laser beam 31 and is moved along synchronously with the laser beam 31 after unblocking and before starting to cut off the laser beam 31.

All of the types of diaphragm 42 also have in common that it is also possible to arrange the diaphragm at a great distance from the surface of the substrate 2. The optics 33 are then either configured to provide a collimated laser beam 31 having essentially no divergence in movement direction 51, or the movement flow of the diaphragm 42 is adapted so as to allow the projection of a cutting-off edge on the surface of the substrate 2 to be held statically in position in spite of a laser beam 31 which is moved relative to the diaphragm edge 45 and is divergent.

In a further configuration of the apparatus, the positioning of the substrate 2 by means of stops at the workpiece receptacle 1 is dispensed with. For this purpose, the laser head 32 has image detection means by which the contours of the substrate 2 can be detected by edge detection.

A method which is carried out with an apparatus according to the second embodiment example having a rigid diaphragm 42.2 substantially corresponds to the method flow described above. Differences consist in the movement of the blocking-out device 4 with the rigid diaphragm 42.2 and rigid diaphragm aperture 43.2. These differences are described below.

As is shown in FIG. 4 at time $t_1$, the laser beam 31 is completely cut off by the edge region 42.3 of the diaphragm frame 42.4 at the commencement of beam guidance. To this end, the diaphragm frame 42.4 is located in a position such that the rigid diaphragm aperture 43.2 is arranged in front of the laser beam 31 in movement direction 51. In so doing, the beam cross section length 38 abuts in the diaphragm plane 41 on the rear diaphragm edge 45 (hereinafter designated as rear edge) viewed in movement direction 51. In a perpendicular projection of the diaphragm plane 41 on the surface of the substrate 2, the rear edge simultaneously occupies a position exactly abutting on the start 71 of fissure.

At the commencement of the beam guidance, the rear edge remains in an unchanged position with respect to the substrate 2 so that the laser beam 31 moves into the rigid diaphragm aperture 43.2 relative to the rear edge. This stationary state is achieved in that the diaphragm frame 42.4 moves relative to the laser beam 31 synchronous with the speed at which the beam is guided. As is shown in FIG. 4 at time $t_2$, the cutting off of the laser beam 31 decreases by degrees through the movement of the laser beam 31 relative to the rigid diaphragm 42.2. As a result of the synchronous movement of the diaphragm frame 42.4, the substrate 2 is first acted upon by the laser beam 31 starting from the start 71 of fissure.

The movement of the diaphragm frame 42.4 synchronous with the beam guidance is continued until the laser beam 31 is completely unblocked. This position is reached at time $t_3$ in FIG. 4 as soon as the laser beam 31 is positioned with its entire beam cross section length 38 in front of the rear edge of the rigid diaphragm aperture 43.2. After this time, the synchronous movement of the diaphragm frame 42.2 can be terminated.

The further beam guidance along the separating fissure 7 is carried out corresponding to FIG. 4 at time $t_4$ with an unchanged position of the diaphragm frame 42.4 relative to the laser beam 31.

As soon as the elliptical beam spot 34 impinges on the end 72 of the separating fissure 7, or the front diaphragm edge 45 of the rigid diaphragm aperture 43.2 (referred to hereinafter as front edge) considered in movement direction 51 abuts on the end 72 of fissure in a perpendicular projection of the diaphragm plane 41 on the surface of the substrate 2, the front edge remains in an unchanged position with respect to the substrate 2. The front edge remains in this position by means of a movement of the diaphragm frame 42.4 synchronous with the speed of the beam guidance. This position is reached at time $t_5$ in FIG. 4.

The laser beam 31 accordingly moves out of the rigid diaphragm aperture 43.2 relative to the front edge. As is shown at time $t_6$ in FIG. 4, the cutting off of the laser beam 31 accordingly increases gradually. The substrate 2 is not acted upon by the laser beam 31 beyond the end 72 of fissure due to the synchronous movement of the diaphragm frame 42.4.

The beam guidance can be terminated when the laser beam 31 abutting with the elliptical beam spot 34 at the end 72 of fissure is located directly behind the end 72 of fissure (indicated at time $t_7$ in FIG. 4 by the extension of the laser beam 31 with dotted line). At this time, the laser beam 31 is completely cut off by the edge region 42.3 of the diaphragm frame 42.4. To this end, the diaphragm frame 42.4 is located in a position such that the rigid diaphragm aperture 43.2 is downstream of the laser beam 31 in movement direction 51. In so doing, the beam cross section length 38 abuts on the front edge in the diaphragm plane 41.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE NUMERALS 1 workpiece receptacle
2 substrate
3 laser source
31 laser beam
32 laser head
33 optics
34 elliptical beam spot
35 beam spot length
36 beam spot width
37 optical axis
38 beam cross section length in the diaphragm plane 41
39 beam cross section width in the diaphragm plane 41
4 blocking-out device
41 diaphragm plane
42 diaphragm
42.1 variable diaphragm
42.2 rigid diaphragm
42.3 edge region
42.4 diaphragm frame
43 diaphragm aperture
43.1 variable diaphragm aperture
43.2 rigid diaphragm aperture
44 blocking-out slide
45 diaphragm edge
5 movement device
51 movement direction
6 control device
7 separating fissure
71 start of fissure
72 end of fissure

What is claimed is:

1. Apparatus for generating separating fissures in a substrate through action of a laser beam with an elliptical beam cross section comprising a workpiece receptacle for receiving a substrate, a laser source for emitting a laser beam, a laser head with optics arranged downstream of the laser source in a beam output direction, having an optical axis, wherein the optical axis and, therefore, the laser beam are directed perpendicularly onto the surface of the received substrate, the optics being configured to shape the laser beam in such a way that it has an elliptical beam cross section and forms an elliptical beam spot on the surface of the substrate, said elliptical beam spot having a beam spot length and a beam spot width, a movement device for moving the laser head in a movement direction along a separating fissure which is to be generated in the received substrate and which has a start and an end, wherein the beam spot length is oriented along the movement direction, a control device for controlling the process flows, a blocking-out device provided in a diaphragm between the optics and the workpiece receptacle perpendicular to the optical axis which communicates with the laser head and which has a diaphragm with an aperture that can be varied with respect to the position and/or size thereof along the movement direction in order to cut off the laser beam in a continuously decreasing or increasing manner over the beam spot length so as to prevent the laser beam from impinging on the substrate before the start of a fissure and beyond the end of a fissure.

2. Apparatus according to claim 1, wherein the diaphragm is a variable diaphragm which is fixedly connected to the laser head, and the diaphragm aperture is a diaphragm aperture that is continuously variable over the length of the diaphragm aperture, with a maximum length that is greater than or equal to a beam cross section length in the diaphragm plane and a width that is greater than or equal to a beam cross section width in the diaphragm plane.

3. Apparatus according to claim 2, wherein the variable diaphragm has at least one blocking-out slide which is movable relative to the laser beam and in the manner of a window blind.

4. Apparatus according to claim 1, wherein the diaphragm is a rigid diaphragm with an edge region which is wider in movement direction than a beam cross section length in the diaphragm plane, the rigid diaphragm being displaceable at the laser head along the movement direction, and the diaphragm aperture being correspondingly a rigid diaphragm aperture, with a length that is greater than or equal to the beam cross section length and a width that is greater than or equal to a beam cross section width in the diaphragm plane.

5. Apparatus according to claim 1, wherein the diaphragm plane is located directly behind the optics at the greatest possible distance from the substrate.

6. Method for generating separating fissures in a substrate through action of a laser beam with an elliptical beam cross section comprising:
  receiving and positioning a substrate in a workpiece receptacle;
  generating a laser beam with an elliptical beam cross section to form an elliptical beam spot with a beam spot length and a beam spot width on the surface of the received substrate;
  directing the laser beam onto the received substrate, wherein the beam spot length is oriented in a direction of a separating fissure which is to be generated and which has a start and an end, guiding the laser beam along the separating fissure to be generated from the start of the fissure to the end of the fissure, wherein the laser beam is cut off at least periodically, namely decreasingly cut off from the start of the fissure and increasingly cut off toward the end of the fissure, by a diaphragm which is arranged in a diaphragm plane and which is guided at least periodically with the laser beam, so that the substrate is not acted upon by the laser beam before the start of the fissure or beyond the end of the fissure.

7. Method according to claim 6, wherein the laser beam is directed onto the substrate in such a way that, irrespective of the diaphragm, the laser beam abuts with its beam spot length on the start of the fissure at the commencement of beam guidance in extension of the separating fissure and abuts with its beam spot length on the end of the fissure at the termination of beam guidance in extension of the separating fissure, wherein, as a result of the provided diaphragm, the laser beam is cut off completely in each instance by the diaphragm.

8. Method according to claim 7, wherein decreasing and increasing cutting off of the laser beam takes place in that a variable diaphragm with a variable diaphragm aperture is used as diaphragm, and the completely closed variable diaphragm aperture is completely opened at the commencement of beam guidance, and the variable diaphragm aperture is completely closed again at the termination of beam guidance, while the variable diaphragm remains stationary in relation to the guided laser beam, wherein the complete opening and closing of the variable diaphragm aperture is effected at a speed corresponding to the guiding of the laser beam.

9. Method according to claim 7, wherein decreasing and increasing cutting off of the laser beam is carried out in that a rigid diaphragm with an edge region and with a rigid diaphragm aperture is used as diaphragm, and the rigid diaphragm whose rigid diaphragm aperture abuts on the start of the separating fissure remains stationary relative to the guided laser beam at the commencement of beam guidance, while the laser beam is guided into the diaphragm aperture until the edge region thereof no longer has a cutting off effect and is then guided along with the laser beam at a speed corresponding to the beam guidance until the rigid diaphragm aperture encounters the end of the fissure and then comes to rest again relative to the guided laser beam, while the laser beam continues to be guided along the edge region until it is completely cut off.

10. Method according to claim 6, wherein decreasing and/or increasing cutting off of the laser beam only takes place when the start of the fissure and/or the end of the fissure lies within the surface of the substrate.

* * * * *